United States Patent [19]

Shirotori

[11] Patent Number: 5,276,356
[45] Date of Patent: Jan. 4, 1994

[54] HIGH SPEED OUTPUT CIRCUIT HAVING CURRENT DRIVING CAPABILITY WHICH IS INDEPENDENT OF TEMPERATURE AND POWER SUPPLY VOLTAGE

[75] Inventor: Tsukasa Shirotori, Yokohama, Japan

[73] Assignee: Kabushiki Kaisha Toshiba, Kawasaki, Japan

[21] Appl. No.: 886,352

[22] Filed: May 21, 1992

[30] Foreign Application Priority Data

May 24, 1991 [JP] Japan ................... 3-120100

[51] Int. Cl.$^5$ ...................... H03K 3/01; H03K 3/26
[52] U.S. Cl. ..................... 307/270; 307/443; 307/263; 307/572
[58] Field of Search ............ 307/270, 263, 264, 490, 307/443, 526, 262, 525, 572

[56] References Cited

U.S. PATENT DOCUMENTS

4,716,313 12/1987 Hori et al. ...................... 307/270
4,894,561 1/1990 Nagami ........................... 307/263
5,170,078 12/1992 Hsueh et al. .................... 307/264

*Primary Examiner*—Timothy P. Callahan
*Attorney, Agent, or Firm*—Finnegan, Henderson, Farabow, Garett & Dunner

[57] ABSTRACT

An output circuit comprises an output transistor, a reference oscillator, a variable frequency oscillator, and a control circuit. The reference oscillator produces a first signal of a reference frequency according to the ideal ON resistance of the output transistor. The variable frequency oscillator generates a second signal capable of varying the oscillation frequency. The phase comparator compares the phase of a first signal from the reference oscillator with that of a second signal from the variable frequency oscillator and then controls the oscillation frequency of the variable frequency oscillator so that these two phases may coincide with each other. The control circuit controls the output transistor so that the current driving capability may be kept constant according to the output of the phase comparator.

19 Claims, 6 Drawing Sheets

HIGH SPEED OUTPUT CIRCUIT HAVING CURRENT DRIVING CAPABILITY WHICH IS INDEPENDENT OF TEMPERATURE AND POWER SUPPLY VOLTAGE

BACKGROUND OF THE INVENTION

1. Field of the Invention

This invention relates to an output circuit used in a semiconductor device with many pins, such as a memory device or an arithmetic unit, and more particularly to a high-speed output circuit.

2. Description of the Related Art

Output circuits of this type are required not only to have a high bus driving capability for high speed operation, but also to suppress noises arising from the simultaneous operation of many output circuits.

Figures 1, 2:
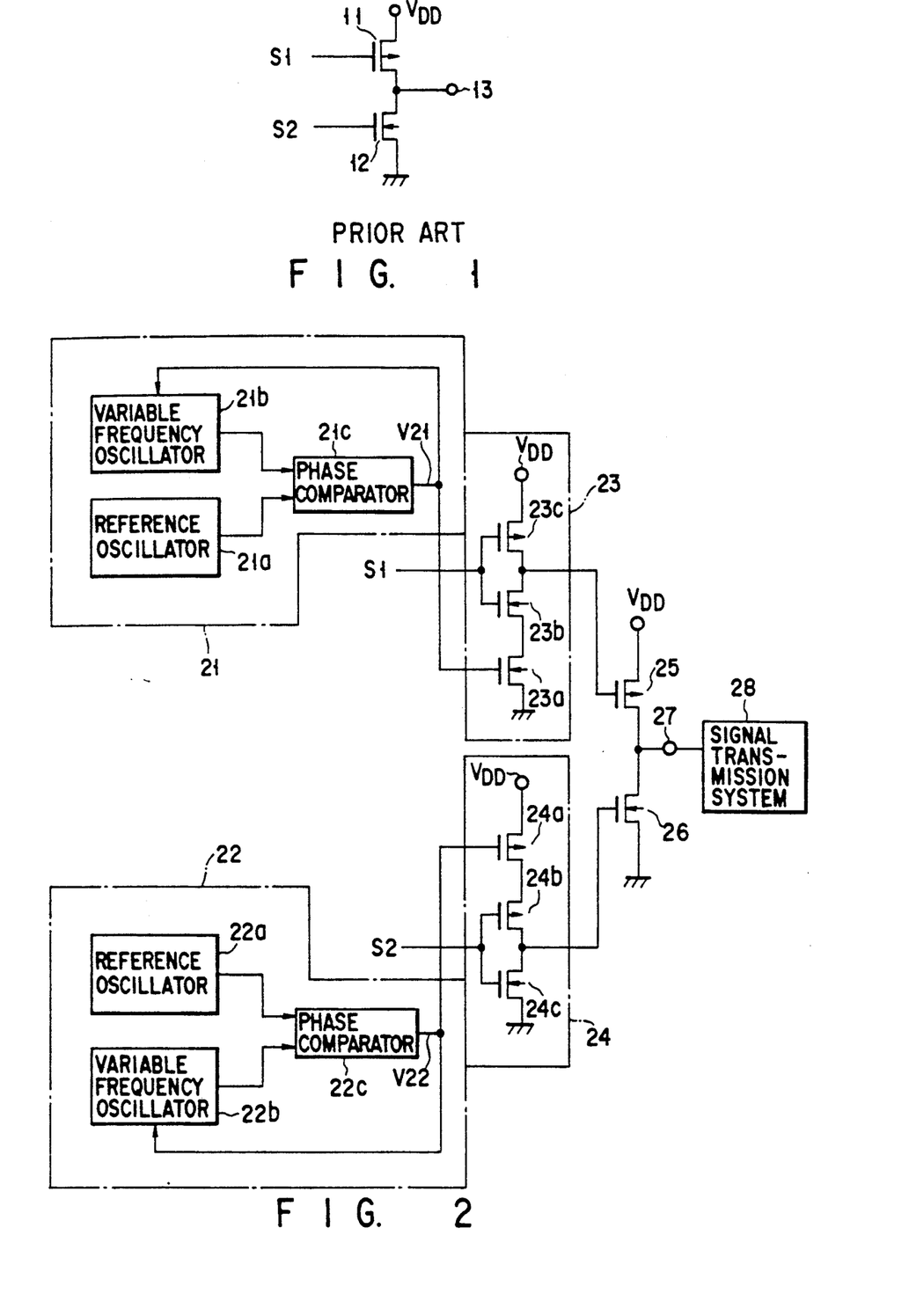
FIG. 1 is a circuit diagram of a conventional output circuit.
FIG. 2 is a circuit diagram of an output circuit according to a first embodiment of the present invention.

FIG. 1 is a circuit diagram of a conventional output circuit. The output circuit is composed of a p-channel MOS transistor 11 for producing a high-level signal and an n-channel MOS transistor 12 for producing a low-level signal. Specifically, the gate of MOS transistor 11 is supplied with a first control signal S1. The MOS transistor 11 has its source connected to the power supply $V_{DD}$, and its drain connected to both the output terminal 13 and the drain of MOS transistor 12. The MOS transistor 12, whose source is connected to the ground, has its gate supplied with a second control signal S2.

The current driving capability of the conventional output circuit is dependent on the power supply voltage and temperature. The impedance of the signal transmission system is not power voltage- or temperature-dependent, but is constant. An ON-resistance is set to the MOS transistor of the output circuit so as to be able to match with the impedance of the signal transmission system when the power supply voltage and temperature are at standard levels. Under conditions of high power supply voltages or low temperatures, the current driving capability of the output circuit increases to lower the ON resistance of the MOS transistor. As a result, the ON resistance cannot match with the impedance of the signal output system, increasing the number of occurrence of noise. Under conditions of low power supply voltages or high temperatures, however, the current driving capability decreases seriously. Thus, it is difficult to reconcile a high bus driving capability with low noise.

To meet both incompatible requirements, a high bus driving capability and low noise, the conventional output circuit is designed to have such a current driving capability as avoids the faulty operation under high-driving conditions liable to a lot of noises, that is, at high power supply voltages or low temperatures. With this design, however, there arises a problem that it operates slower under low-driving conditions, that is, at low power supply voltages or high temperatures.

SUMMARY OF THE INVENTION

Accordingly, the object of the present invention is to provide an output circuit capable of reconciling a high bus driving capability with low noise independently of temperature and power supply voltage.

The foregoing object is accomplished by providing an output circuit comprising: an output transistor for supplying a signal corresponding to the level of a control signal; a reference oscillator for producing a first signal of a reference frequency according to an ideal ON resistance of the output transistor; a variable frequency oscillator, capable of varying the oscillation frequency, for producing a second signal; a phase comparator for comparing the phase of the first signal from the reference oscillator with that of the second signal from the variable frequency oscillator, and then controlling the oscillation frequency of the variable frequency oscillator so that the first signal's phase may agree with the second signal's phase; and a control circuit for supplying to the output transistor the control signal that controls the current driving capability of said output transistor according to the output of said phase comparator.

With such an arrangement, the phase comparator controls the oscillation frequency of the variable frequency oscillator so that the phase of the first signal from the reference oscillator may agree with that of the second signal from the variable frequency oscillator. The resistance of the resistor that determines the oscillation frequency of the reference oscillator is set according to the ideal ON resistance of the output transistor. With the voltage from the phase comparator being supplied to the output transistor via the drive control circuit, a rise in temperature or a drop in power supply voltage allows the control circuit to increase the current driving capability of the output transistor, whereas a fall in temperature or an increase in power supply voltage permits the control circuit to decrease the current driving capability. In consequence, the current driving capability of the output transistor can be made constant, irrespective of temperature or power supply voltage. This makes it possible to achieve an output transistor with a high bus driving capability, while suppressing noises.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

FIG. 2 is a circuit diagram of an output circuit according to a first embodiment of the present invention. The output circuit is made up of PLL (Phase Locked Loop) control sections 21 and 22, drive control circuits 23 and 24, and output transistors 25 and 26. The PLL control section 21 is composed of a first reference oscillator 21a for producing a reference frequency signal, a first variable frequency oscillator 21b capable of varying the oscillation frequency, and a first phase comparator 21c for comparing the phase of the output of the reference oscillator 21a with that of the variable frequency oscillator 21b and then producing a first control voltage V21 proportional to the resulting phase difference. The control voltage V21 from the phase comparator 21c is supplied to the variable frequency oscillator 21b to control the oscillation frequency of the variable frequency oscillator 21b so that the phase of the output of the reference oscillator 21a may coincide with that of the variable frequency oscillator 21b. On the other hand, the PLL control section 22 is composed of a second reference oscillator 22a for producing a reference frequency signal, a second variable frequency oscillator 22b capable of varying the oscillation frequency, and a second phase comparator 22c for comparing the phase of the output of the reference oscillator 22a with that of the variable frequency oscillator 22b and then producing a second control voltage V22 proportional to the resulting phase difference. The control voltage V22 from the phase comparator 22c is supplied to the variable frequency oscillator 22b to control the oscillation frequency of the variable frequency oscillator 22b so that the phase of the output of the reference oscillator 22a may coincide with that of the variable frequency oscillator 22b.

The control voltage V21 from the first phase comparator 21c is supplied to the gate of an n-channel MOS transistor 23a included in the first drive control circuit 23. The MOS transistor 23a has its source connected to the ground and its drain to the source of an n-channel MOS transistor 23b. The MOS transistor 23b has its drain connected to the drain of a p-channel MOS transistor 23c, whose source is connected to the power supply $V_{DD}$. The gate of each of MOS transistors 23b and 23c is supplied with the first control signal S1. The drain of each of MOS transistors 23b and 23c is connected to the gate of a p-channel output MOS transistor 25.

Similarly, the control voltage V22 from the second phase comparator 22c is supplied to the gate of a p-channel MOS transistor 24a included in the second drive control circuit 24. The MOS transistor 24a has its source connected to the power supply $V_{DD}$ and its drain to the source of an p-channel MOS transistor 24b. The MOS transistor 24b has its drain connected to the drain of an n-channel MOS transistor 24c, whose source is connected to the ground. The gate of each of MOS transistors 24b and 24c is supplied with the second control signal S2. The drain of each of MOS transistors 24b and 24c is connected to the gate of an n-channel output MOS transistor 26.

The p-channel MOS transistor 25 has its source connected to the power supply $V_{DD}$ and its drain connected to both the output terminal 27 and the drain of the n-channel MOS transistor 26, whose source is connected to the ground. The output terminal 27 is connected to, for example, a signal transmission system 28 such as a bus. The impedance of the signal transmission system 28 is set to about 50 to 100 Ω, and several types of circuits (not shown) are connected to the system 28.

The first and second control signals S1 and S2 determine whether output MOS transistors 25 and 26 are turned on, respectively. The first and second drive control circuits 23 and 24 determine the current driving capability of output MOS transistors 25 and 26, respectively.

It is required that any MOS transistors incorporated in the PLL control sections 21 and 22 have dimensions (particularly, the channel width) which is equal to those of the output MOS transistors 25 and 26. In other words, the size ratio of the former to the latter must be 1:1. If the size ratio is 1:1, however, the pattern area will increase. (This is because the output transistors are large in most cases.) To prevent an increase in the pattern area, the transistors constituting the PL control sections 21 and 22 can be ten times smaller than the output transistors 25 and 26. In this case, the ON resistance of each of the output MOS transistors 25 and 26 can be made to match with the impedance of the signal transmission system 28 by setting the resistance value of each of resistors for determining the ideal ON resistance in the reference oscillators 21a and 22a, ten times higher than the impedance of the signal transmission system 28. Even if the resistance value of each resistor is set ten times higher than the impedance of the signal transmission system 28, the value is generally only 500 to 1KΩ. Therefore, such increase in resistance is negligible as compared to the advantage of reduction in pattern area, achieved by decreasing the size of each of the transistors constituting a PLL to 1/10 of a conventional one. Thus, proportional relation can be imparted to the elements, without increasing the pattern area.

In general, when the impedance of the signal transmission system 28 connected to the output terminal 27 disagrees with the driving capability, or the resistance in the ON state, of each of MOS transistors 25 and 26, noise occurs. In the conventional output circuit of FIG. 1, variations in temperature or power supply voltage change the current driving capability of the MOS transistors, leading to an impedance mismatch with the transmission system not shown.

In the present invention, however, the oscillation frequency of each of output transistors 21a and 22a is determined by the ideal ON resistance of the output MOS transistors 25 and 26, or by the resistance proportional to and matching the impedance of the signal transmission system 28. Furthermore, the ON resistance of each of output MOS transistors 25 and 26 is controlled by the PLL control circuits 21 and 22. The PLL control circuits 21 and 22 include variable frequency oscillators 21b and 22b, respectively, which use MOS transistors proportional in size to the output MOS transistors 25 and 26. The resistors determining the oscillation frequency of the reference oscillators 21a and 22a are formed of diffused or polysilicon layers relatively stable in terms of temperature or voltage in the manufacturing processes of semiconductor devices. Thus the current driving capability of the output MOS transistors 25 and 26 can be compensated for (kept constant), irrespective of temperature or power supply voltage. That is, the current driving capability is held constant by decreasing the driving capability of the output MOS transistors 25 and 26 under conditions of high power supply voltages or low temperatures, while increasing the driving capability under conditions of low power supply voltages or high temperature.

Figure 3:
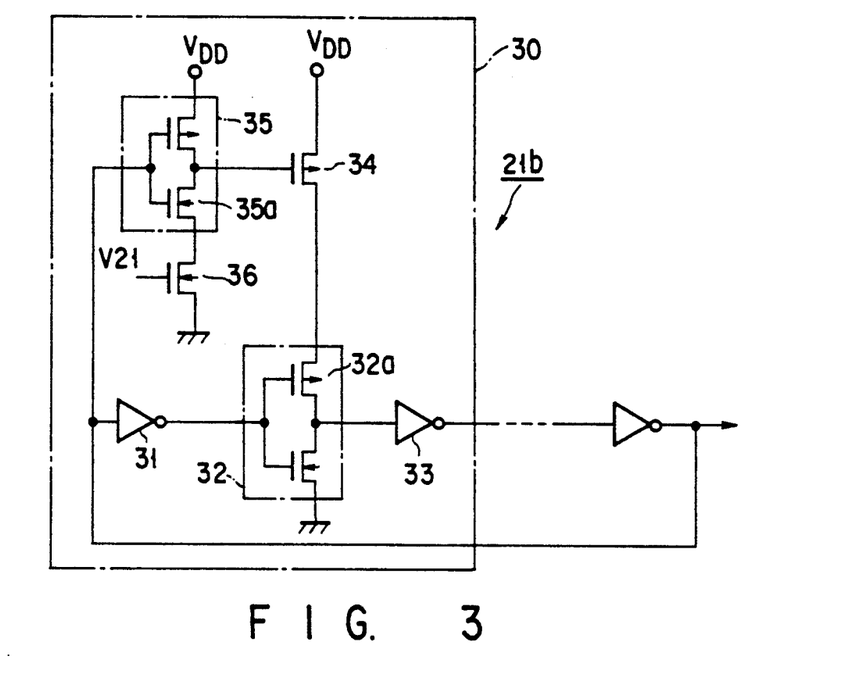
FIG. 3 is a circuit diagram of a first variable frequency oscillator in the FIG. 2 circuit.

FIG. 3 shows the configuration of the first variable frequency oscillator 21b in the FIG. 2 circuit.

The variable frequency oscillator 21b is a ring oscillator in which more than one circuit block 30 enclosed by a single-dash chain line is connected to each other. In the circuit block 30, the inverter circuits 31, 32, and 33 are cascade-connected. The output signal from the final-stage circuit block is fed back to the input terminal of the inverter circuit 31. The current path of the p-channel MOS transistor 34 is connected between the power supply $V_{DD}$ and the source of p-channel MOS transistor 32a constituting the inverter circuit 32. The gate of the MOS transistor 34 is connected to the output terminal of inverter circuit 35, whose input terminal is connected to the input terminal of the inverter circuit 31. The current path of the n-channel MOS transistor 36 is connected between the ground and the source of the n-channel MOS transistor 35a constituting the inverter 35. The gate of the MOS transistor 36 is supplied with the control voltage V21 from the phase comparator 21c. The MOS transistor 34 controls the speed at which the output signal of the inverter circuit 32 rises to a high level. It is the inverter circuit 35 that controls the conduction of MOS transistor 34. The output of inverter circuit 35 is controlled by the control voltage V21. That is, the control voltage V21 controls the ON resistance of MOS transistor 34, determining the speed at which the output of inverter circuit 32 rises to a high level. Changing the rising speed of the output of inverter circuit 32 changes the frequency of oscillation.

Figure 4:
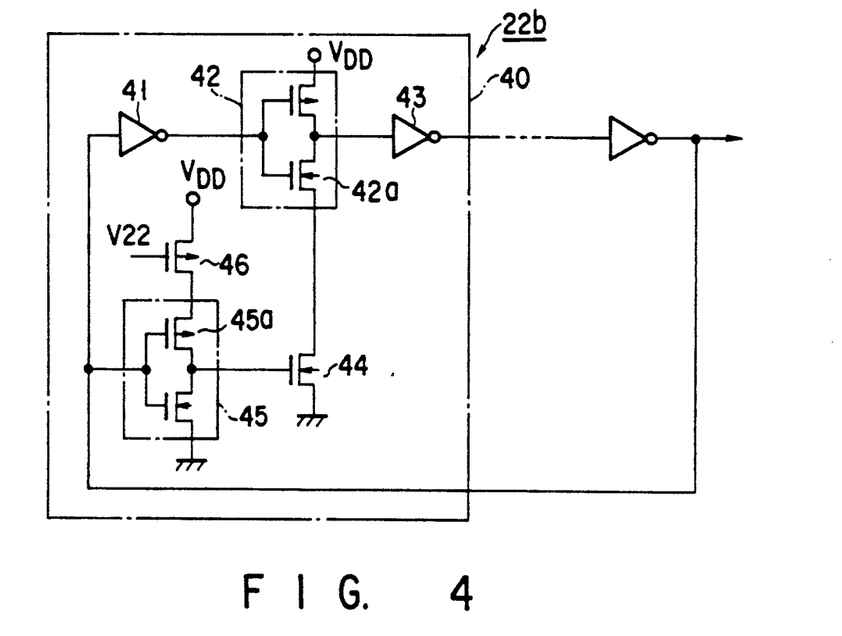
FIG. 4 is a circuit diagram of a second variable frequency oscillator in the FIG. 2 circuit.

FIG. 4 shows the configuration of the second variable frequency oscillator 22b in the FIG. 2 circuit.

Like the variable frequency oscillator 21b, the variable frequency oscillator 22b is a ring oscillator in which more than one circuit block 40 enclosed by a single-dash chain line is connected to each other. In the circuit block 40, the inverter circuits 41, 42, and 43 are cascade-connected. The output signal from the final-stage circuit block is fed back to the input terminal of the inverter circuit 41. The current path of the n-channel MOS transistor 44 is connected between the ground and the source of n-channel MOS transistor 42a constituting the inverter circuit 42. The gate of the MOS transistor 44 is connected to the output terminal of inverter circuit 45, whose input terminal is connected to the input terminal of the inverter circuit 41. The current path of the p-channel MOS transistor 46 is connected between the power supply $V_{DD}$ and the source of the p-channel MOS transistor 45a constituting the inverter circuit 45. The gate of the MOS transistor 46 is supplied with the control voltage V22 from the phase comparator 22c. The MOS transistor 44 controls the speed at which the output signal of the inverter circuit 42 falls to a low level. It is the inverter circuit 45 that controls the conduction of MOS transistor 44. The output of inverter circuit 45 is controlled by the control voltage V22. That is, the control voltage V22 controls the ON resistance of MOS transistor 44, determining the speed at which the output of inverter circuit 42 falls to a low level. Changing the falling speed of the output of inverter circuit 42 changes the frequency of oscillation.

Figure 5:
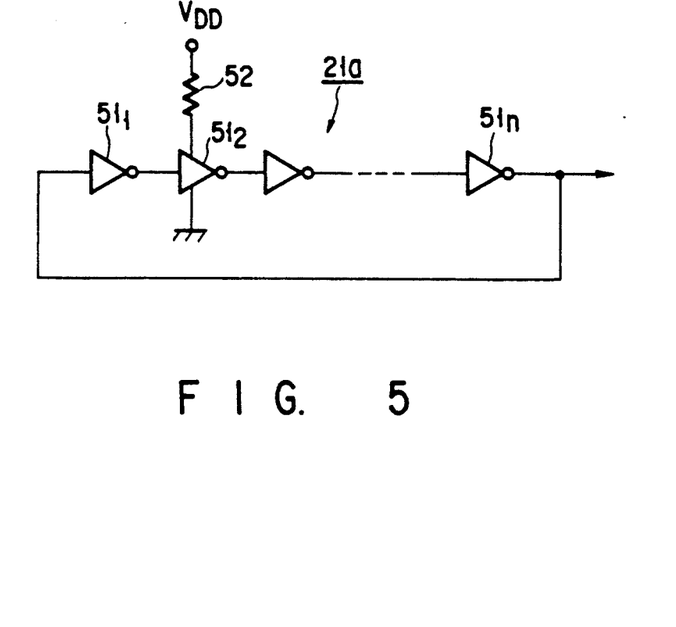
FIG. 5 is a circuit diagram showing the structure of a first reference oscillator in the FIG. 2 circuit.

FIG. 5 illustrates the arrangement of the first reference oscillator 21a in the FIG. 2 circuit.

The reference oscillator 21a is a ring oscillator in which inverter circuits $51_1, 51_2, \ldots, 51_n$ are cascade-connected with the output terminal of inverter circuit $51_n$ connected to the input terminal of inverter circuit $51_1$. It produces an oscillating signal with a reference frequency of, for example, 100 MHz. A resistor 52 is connected between the power supply $V_{DD}$ and the source of p-channel MOS transistor (not shown) forming the inverter circuit $51_2$. The resistance of the resistor 52 has a proportional relationship with the signal transmission system 28 for impedance matching.

Figure 6:
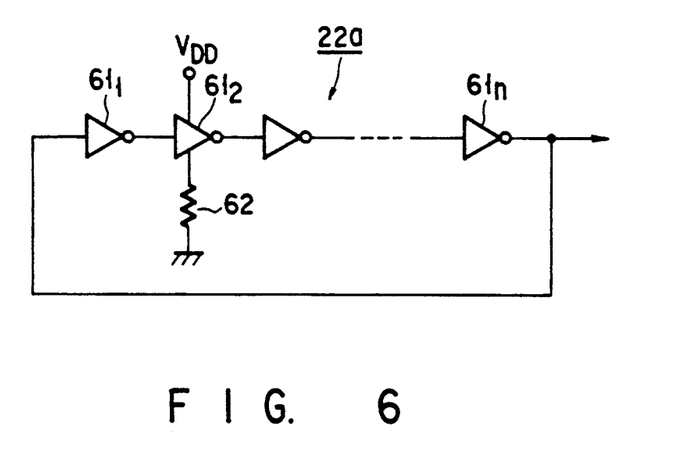
FIG. 6 is a circuit diagram of a second reference oscillator in the FIG. 2 circuit.

FIG. 6 illustrates the arrangement of the second reference oscillator 22a in the FIG. 2 circuit.

The reference oscillator 22a is a ring oscillator in which inverter circuits $61_1, 61_2, \ldots, 61_n$ are cascade-connected with the output terminal of inverter circuit $61_n$ connected to the input terminal of inverter circuit $61_1$. A resistor 62 is connected between the power supply $V_{DD}$ and the source of n-channel MOS transistor (not shown) forming the inverter circuit $61_2$. The resistance of the resistor 62 has a proportional relationship with the signal transmission system 28 for impedance matching.

With such an arrangement, the MOS transistor 34 of FIG. 3 and the resistor 52 of FIG. 5 determine the frequency of the oscillator. When the frequency of the signal from the variable frequency oscillator 21b has become equal to that of the signal from the reference oscillator 21a, the resistance of the resistor 52 is equal to the ON resistance of the MOS transistor 34 whose size is proportional to those of output MOS transistors 25 and 26. Thus, it is possible to compensate for the driving capability of output MOS transistor 25, or keep the capability constant regardless of temperature or power supply voltage, by supplying the control voltage V21 from the phase comparator 21c to the output MOS transistor 25 via the drive control circuit 23.

Similarly, it is possible to compensate for the driving capability of output MOS transistor 26 by supplying the control voltage V22 from the phase comparator 22c to the output MOS transistor 26 via the drive control circuit 24.

Figure 7:
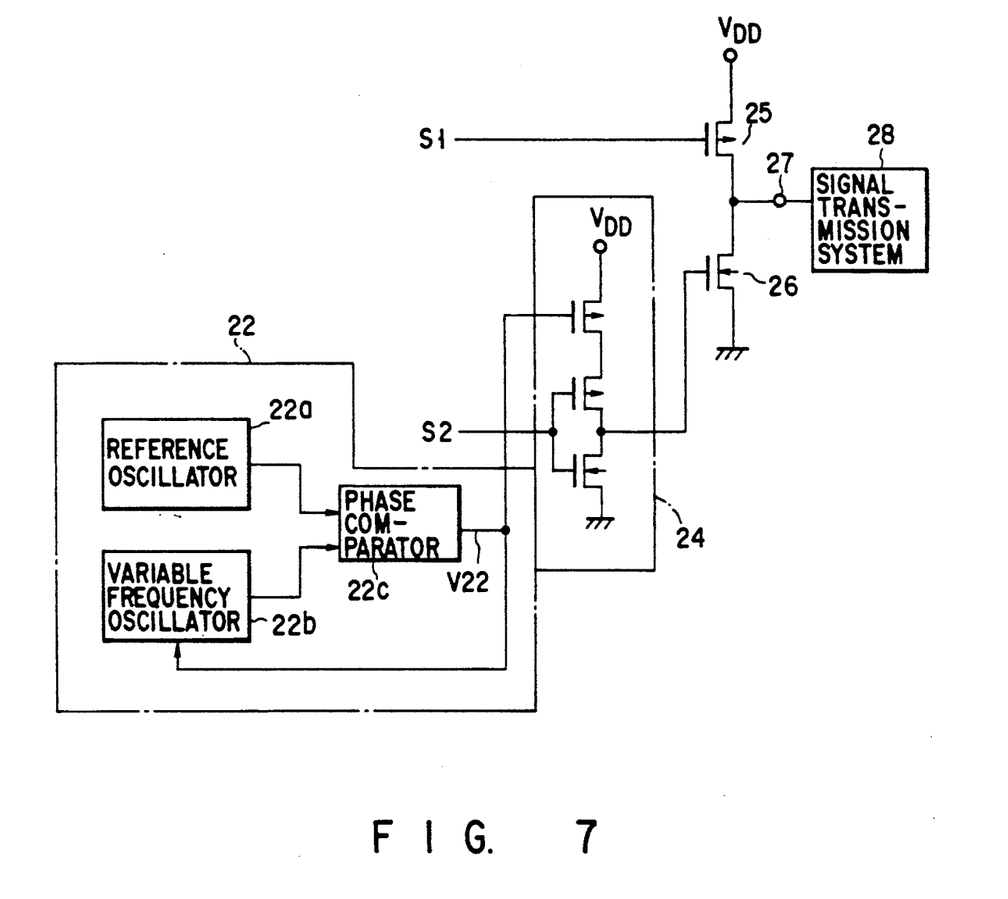
FIG. 7 is a circuit diagram of an output circuit according to a second embodiment of the present invention.

FIG. 7 is a circuit diagram of an output circuit according to a second embodiment of the present invention. The same parts as those in FIG. 2 are indicated by the same reference characters, and their detailed explanation will be omitted.

In the output circuit, noise is generally more liable to occur in supplying a low-level signal than a high-level signal. Taking into account this fact, in this embodiment, only the output MOS transistor 26 supplying a low-level signal is connected to the PLL control section 22 and drive control circuit 24. The gate of output transistor 25 is supplied directly with the control signal S1. The second embodiment thus constructed provides almost the same effects as those of the first embodiment.

Figure 8:
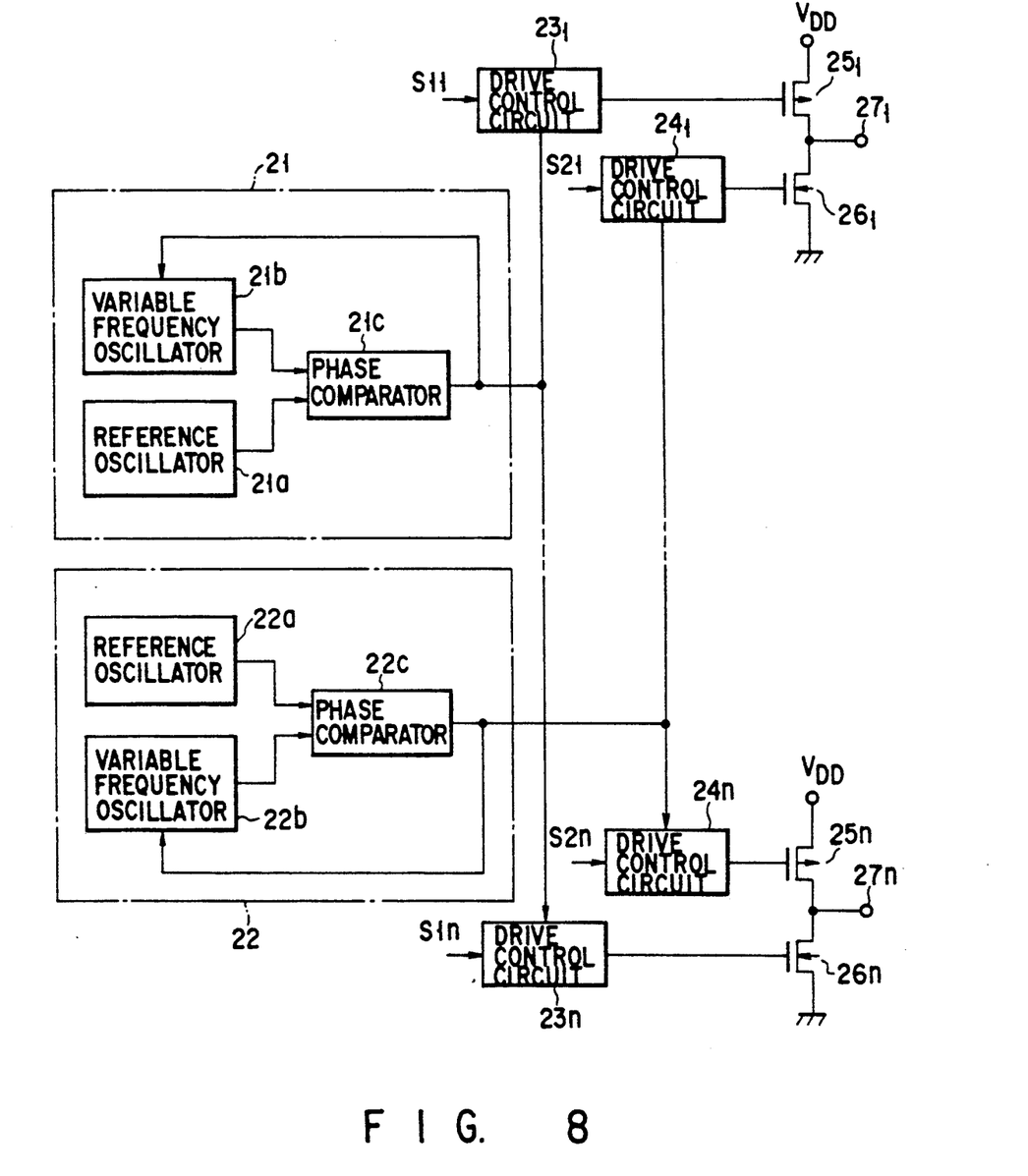
FIG. 8 is a circuit diagram of an output circuit according to a third embodiment of the present invention.

FIG. 8 is a circuit diagram of an output circuit for control of many output MOS transistors, according to a third embodiment of the present invention.

Each of the many output MOS transistors is of the same size, a pair of PLL control sections 21 and 22 can control many MOS transistors. Specifically, the gates of output MOS transistors $25_1, \ldots, 25_n$ are connected to the drive control circuits $23_1, \ldots, 23_n$, respectively, each of which is controlled by the PLL control section 21. The gates of output MOS transistors $26_1, \ldots, 26_n$ are connected to the drive control circuits $24_1, \ldots, 24_n$, respectively, each of which is controlled by the PLL control section 22. This arrangement enables the pair of PLL control sections 21 and 22 to control the many MOS transistors $25_1, \ldots, 25_n, 26_1, \ldots, 26_n$.

With such a configuration, even when the number of output MOS transistors increases, an increase in the chip area can be minimized, which keeps the current driving capability of the output transistors constant independently of changes in temperature or power supply voltage.

Figure 9:
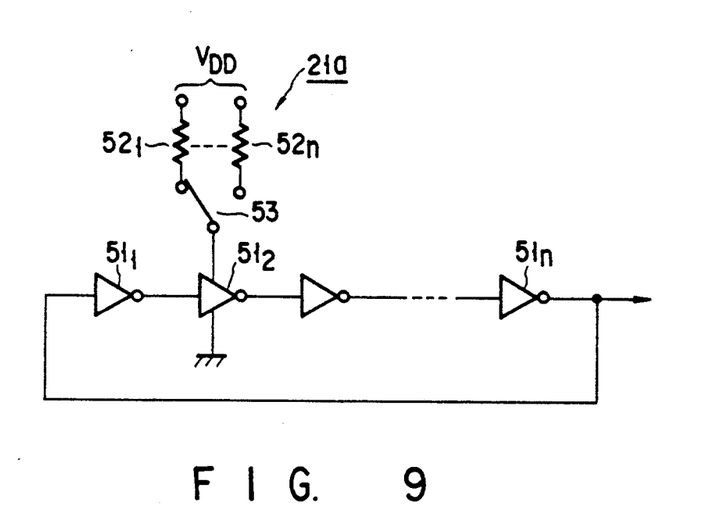
FIG. 9 is a circuit diagram showing another structure of the first reference oscillator of FIG. 5.
Figure 10:
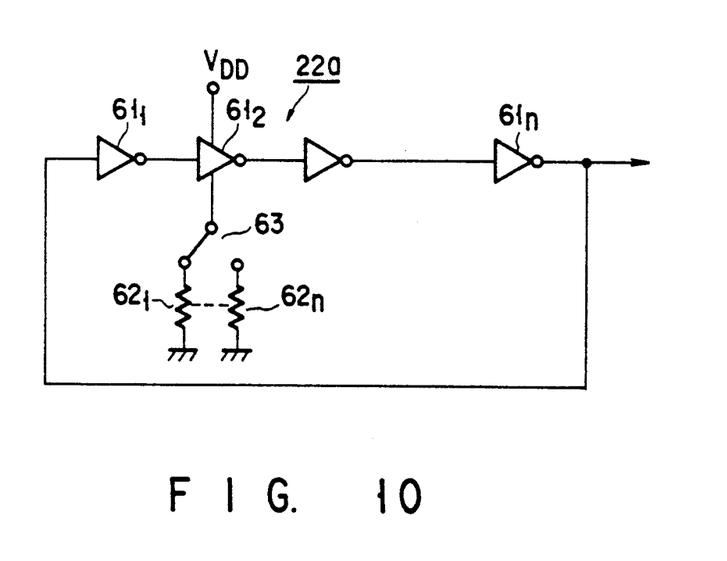
FIG. 10 is a circuit diagram showing another structure of the second reference oscillator of FIG. 6.

FIGS. 9 and 10 show other constructions of the reference oscillators 21a and 22a shown in FIGS. 5 and 6, respectively.

In the FIG. 9 construction, an inverter circuit $51_2$ included in the reference oscillator 21a is connected to a selector 53, which selects one from a plurality of resistors $52_1, \ldots, 52_n$ whose resistances are different from each other. Because the resistors $52_1, \ldots, 52_n$ determining the oscillation frequency of the reference oscillator 21a can be selected by the selector 53, the optimum resistance can be always selected according to the impedance of the signal transmission system 28.

In the FIG. 10 construction, an inverter circuit 612 included in the reference oscillator 22a is connected to a selector 63, which selects one from a plurality of resistors $62_1, \ldots, 62_n$ whose resistances are different from each other. Because the resistors $62_1, \ldots, 62_n$ determining the oscillation frequency of the reference oscillator 22a can be selected by the selector 63, the optimum resistance ca be always selected according to the impedance of the signal transmission system 28.

The selection of resistors $52_1, \ldots, 52_n, 62_1, \ldots, 62_n$ can be achieved in two ways: one is to connect the selected resistor with a metal wiring layer in the manufacture of the semiconductor device; and the other is to select the resistor using an electric circuit after the manufacture. Use of the variable resistance and PLL control requires no modification of the other circuits even when the reference oscillation frequency changes, and allows the setting of the ON resistance of the output MOS transistor so as to reflect the selected resistance.

The present invention is not limited to the above embodiments, but may be practiced or embodied in still other ways without departing from the spirit or essential character thereof.

What is claimed is:

1. An output circuit comprising:
   an output transistor for supplying a signal corresponding to the level of a control signal;
   reference oscillator means for producing a first signal of a reference frequency according to an ideal ON resistance of said output transistor;
   variable frequency oscillator means, capable of varying the oscillation frequency, for producing a second signal;
   phase comparator means for comparing the phase of the first signal from said reference oscillator means with that of the second signal from said variable frequency oscillator means, and then controlling the oscillation frequency of said variable frequency oscillator means so that the first signal's phase may agree with the second signal's phase; and
   control means for controlling the current driving capability of said output transistor according to the output of said phase comparator means.

2. An output circuit according to claim 1, wherein said reference oscillator means contains a ring oscillator with a plurality of inverter circuits, and a resistor the resistance of which has a proportional relationship with an impedance of a signal transmission system connected to said output transistor for impedance matching, and which controls the falling to a low level of the output of at least one of said plurality of inverter circuits.

3. An output circuit according to claim 1, wherein said reference oscillator means contains a ring oscillator with a plurality of inverter circuits, a plurality of resistors the resistances of which differ from each other and which control the falling to a low level of the output of at least one of said plurality of inverter circuits, and selector means for selecting from said plurality of resistors a resistor whose resistance has a proportional relationship with an impedance of a signal transmission system connected to said output transistor for impedance matching.

4. An output circuit according to claim 1, wherein said variable frequency oscillator means contains a transistor whose size is proportional to that of output transistor.

5. An output circuit according to claim 1, wherein said variable frequency oscillator means contains a ring oscillator with a plurality of inverter circuits, and a transistor that, based on the level of said control signal, controls the falling to a low level of the output of at least one of said plurality of inverter circuits.

6. An output circuit according to claim 1, wherein said control means contains a first transistor of a first conductivity type whose current path i connected at one end to the power supply and whose gate is supplied with the output signal for said phase comparator means, a second transistor of a first conductivity type whose current path is connected at one end to the other end of the current path of said first transistor and whose gate is supplied with said control signal, and a third transistor of a second conductivity type whose current path is connected at one end to the other end of the current path of said second transistor, with the other end being connected to the ground, and whose gate is supplied with said control signal.

7. An output circuit comprising:
   a first output transistor of a first conductivity type for supplying a signal according to the level of a first control signal;
   a second output transistor of a second conductivity type, the current path of which is connected at one end to one end of the current path of said first output transistor, and which supplies a signal according to the level of a second control signal;
   a first reference oscillator means for producing a first signal of a reference frequency according to an ideal ON resistance of said first output transistor;
   a second reference oscillator means for producing a second signal of a reference frequency according to an ideal ON resistance of said second output transistor;
   a first variable frequency oscillator means which contains a transistor whose size is proportional to that of said first output transistor, and which produces a third signal capable of varying the frequency;
   a second variable frequency oscillator means which contains a transistor whose size is proportional to that of said second output transistor, and which produces a fourth signal capable of varying the frequency;

a first phase comparator means for comparing the phase of the first signal from said first reference oscillator means with that of the third signal from said first variable frequency oscillator means, and then controlling said first variable frequency oscillator means so that the phase of said first signal may agree with that of said third signal;

a second phase comparator means for comparing the phase of the second signal from said second reference oscillator means with that of the fourth signal from said second variable frequency oscillator means, and then controlling said second variable frequency oscillator means so that the phase of said second signal may agree with that of said fourth signal;

a first control means for controlling the current driving capability of said first output transistor according to the output of said first phase comparator means; and a second control means for controlling the current driving capability of said second output transistor according to the output of said second phase comparator means.

8. An output circuit according to claim 7, wherein said first reference oscillator means contains a ring oscillator with a plurality of inverter circuits, and a resistor the resistance of which has a proportional relationship with an impedance of a signal transmission system connected to said first and second output transistors for impedance matching, and which controls the rising to a high level of the output of at least one of said plurality of inverter circuits.

9. An output circuit according to claim 7, wherein said first reference oscillator means contains a ring oscillator with a plurality of inverter circuits, a plurality of resistors the resistances of which differ from each other and which control the rising to a high level of the output of at least one of said plurality of inverter circuits, and selector means for selecting from said plurality of resistors a resistor whose resistance has a proportional relationship with an impedance of a signal transmission system connected to said first and second output transistors for impedance matching.

10. An output circuit according to claim 7, wherein said second reference oscillator means contains a ring oscillator with a plurality of inverter circuits, and a resistor the resistance of which has a proportional relationship with an impedance of a signal transmission system connected to said first and second output transistors for impedance matching, and which controls the falling to a low level of the output of at least one of said plurality of inverter circuits.

11. An output circuit according to claim 7, wherein said second reference oscillator means contains a ring oscillator with a plurality of inverter circuits, a plurality of resistors the resistances of which differ from each other and which control the falling to a low level of the output of at least one of said plurality of inverter circuits, and selector means for selecting from said plurality of resistors a resistor whose resistance has a proportional relationship with an impedance of a signal transmission system connected to said first and second output transistors for impedance matching.

12. An output circuit according to claim 7, wherein said first variable frequency oscillator means contains a transistor whose size is proportional to that of said first output transistor.

13. An output circuit according to claim 7, wherein said second variable frequency oscillator means contains a transistor whose size is proportional to that of said second output transistor.

14. An output circuit according to claim 7, wherein said first variable frequency oscillator means contains a ring oscillator with a plurality of inverter circuits, and a transistor which controls the rising to a high level of the output of at least one of said plurality of inverter circuits according to the level of said first control signal.

15. An output circuit according to claim 7, wherein said second variable frequency oscillator means contains a ring oscillator with a plurality of inverter circuits, and a transistor which controls the falling to a low level of the output of at least one of said plurality of inverter circuits according to the level of said second control signal.

16. An output circuit according to claim 7, wherein said first control means contains a first transistor of a first conductivity type whose current path is connected at one end to the power supply and whose gate is supplied with said first control signal, a second transistor of a second conductivity type whose current path is connected at one end to the other end of the current path of said first transistor and whose gate is supplied with said firs[control signal, and a third transistor of a second conductivity type whose current path is connected at one end to the other end of the current path of said second transistor, with the other end being connected to the ground, and whose gate is supplied with the output signal for said first phase comparator means.

17. An output circuit according to claim 7, wherein said second control means contains a first transistor of a first conductivity type whose current path is connected at one end to the power supply and whose gate is supplied with the output signal from said phase comparator means, a second transistor of a first conductivity type whose current path is connected at one end to the other end of the current path of said first transistor and whose gate is supplied with said second control signal, and a third transistor of a second conductivity type whose current path is connected at one end to the other end of the current path of said second transistor, with the other end being connected to the ground, and whose gate is supplied with said second signal.

18. An output circuit comprising:

n first output transistors of a first conductivity type each of which supplies a signal according to the level of each of n first control signals;

n second output transistors of a second conductivity type each of which has its current path connected at one end to one end of the current path of each of said n first output transistors, and which supplies a signal according to the level of each of n second control signals;

a first reference oscillator means for producing a first signal of a reference frequency according to an ideal ON resistance of each of said first output transistors;

a second reference oscillator means for producing a second signal of a reference frequency according to an ideal ON resistance of each of said second output transistors;

a first variable frequency oscillator means which contains a transistor whose size is proportional to that of said first output transistor, and which produces a third signal capable of varying the oscillation frequency;

a second variable frequency oscillator means which contains a transistor whose size is proportional to that of said second output transistor, and which produces a fourth signal capable of varying the oscillation frequency;

a first phase comparator means which compares the phase of the first signal from said first reference oscillator means with that of the third signal from said first variable frequency oscillator means and then controls said first variable frequency oscillator means so that the phase of said first signal may agree with that of said third signal;

a second phase comparator means which compares the phase of the second signal from said second reference oscillator means with that of the fourth signal from said second variable frequency oscillator means and then controls said second variable frequency oscillator means so that the phase of said second signal may agree with that of said fourth signal;

n first control means each of which controls the current driving capability of each of said n first output transistors according to the output of said first phase comparator means; and n second control means each of which controls the current driving capability of each of said n second output transistors according to the output of said second phase comparator means.

19. An output circuit according to claim 18, wherein said n first output transistors have the same size, and said n second output transistors have the same size.

* * * * *

UNITED STATES PATENT AND TRADEMARK OFFICE
CERTIFICATE OF CORRECTION

PATENT NO. : 5,276,356
DATED : January 04, 1994
INVENTOR(S) : Tsukasa SHIROTORI

It is certified that error appears in the above-indentified patent and that said Letters Patent is hereby corrected as shown below:

Attorney, Agent, or Firm, title page, line 2, change "Garett" to --Garrett--.

Claim 6, column 8, line 31, change "i" to --is--.

Claim 10, column 10, line 26, change "firs[control" to --first control--.

Signed and Sealed this

Twentieth Day of September, 1994

Attest:

BRUCE LEHMAN

Attesting Officer          Commissioner of Patents and Trademarks